(12) United States Patent
Jung et al.

(10) Patent No.: US 7,825,593 B2
(45) Date of Patent: Nov. 2, 2010

(54) ORGANIC ELECTRO-LUMINESCENCE DISPLAY DEVICE AND METHOD OF FABRICATING THE SAME

(75) Inventors: Young Ro Jung, Gyeongsangbuk-do (KR); Jae Hyoung Ju, Daegu (KR)

(73) Assignee: LG Electronics Inc., Seoul (KR)

( * ) Notice: Subject to any disclaimer, the term of this patent is extended or adjusted under 35 U.S.C. 154(b) by 752 days.

(21) Appl. No.: 11/084,791

(22) Filed: Mar. 21, 2005

(65) Prior Publication Data
US 2005/0212415 A1 Sep. 29, 2005

(30) Foreign Application Priority Data
Mar. 23, 2004 (KR) ...................... 10-2004-0019684

(51) Int. Cl.
*H01L 51/50* (2006.01)
*H01L 51/56* (2006.01)
(52) U.S. Cl. .................. 313/509; 313/506; 313/503
(58) Field of Classification Search .......... 313/498–512
See application file for complete search history.

(56) References Cited

U.S. PATENT DOCUMENTS

| | | | | |
|---|---|---|---|---|
| 6,157,127 | A * | 12/2000 | Hosokawa et al. | 313/506 |
| 2004/0007705 | A1* | 1/2004 | Song et al. | 257/72 |
| 2004/0081836 | A1* | 4/2004 | Inoue et al. | 428/469 |
| 2005/0116629 | A1 | 6/2005 | Takamura et al. | |

FOREIGN PATENT DOCUMENTS

| | | |
|---|---|---|
| EP | 0 888 035 A1 | 12/1998 |
| JP | 10 106751 A | 7/1998 |
| JP | 2000-91083 A | 3/2000 |
| JP | 2003-127391 A | 5/2003 |
| JP | 2003-127397 A | 5/2003 |
| KR | 10-0273848 B1 | 12/2000 |
| KR | 10-0392909 B1 | 3/2004 |
| WO | WO-03/026012 A | 3/2003 |
| WO | WO-03/075616 A | 9/2003 |

OTHER PUBLICATIONS

Machine translation of JP 10-106751.*

* cited by examiner

*Primary Examiner*—Nimeshkumar D Patel
*Assistant Examiner*—Anthony T Perry
(74) *Attorney, Agent, or Firm*—Birch, Stewart, Kolasch & Birch, LLP

(57) ABSTRACT

This invention relates to an organic electro-luminescence device and a method of fabricating the same that is capable of reducing an inverse taper of a bus electrode.

An organic electro-luminescence display device comprises: an anode electrode including a transparent electrode and a bus electrode; a cathode electrode crossing the anode electrode; and an organic layer located at a cross both the anode electrode and the cathode electrode, wherein the bus electrode has an inclination angle of 30° to 70°.

10 Claims, 12 Drawing Sheets

ORGANIC ELECTRO-LUMINESCENCE DISPLAY DEVICE AND METHOD OF FABRICATING THE SAME

This application claims the benefit of Korean Patent Application No. P2004-19684 filed in Korea on Mar. 23, 2004, which is hereby incorporated by reference.

BACKGROUND OF THE INVENTION

1. Field of the Invention

This invention relates to an electro-luminescence display device, and more particularly, to an organic electro-luminescence display device and a method of fabricating the same that is capable of reducing an inverse taper of a bus electrode.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED) device, a plasma display panel (PDP) and an electro-luminescence (EL) display device, etc. device. Especially, the EL display device has characteristics of a wide viewing angle, a high aperture rate and a high color purity, etc., such that it can be highlighted into a post-generation display device.

Such the EL display device comprises an anode electrode and a cathode electrode 12 with an organic layer therebetween, wherein the organic layer includes a hole carrier layer, a light-emitting layer, and an electron carrier layer. Electrons and holes emitted from these anode electrode and cathode electrode are re-combined with each other, thereby generating a visible light. At this time, the generated visible light is emitted, via the anode electrode, into an exterior to thereby display a predetermined picture or image.

Meanwhile, as shown in FIG. 1, an anode electrode 52 includes: a transparent 56 formed on a substrate 51; and a bus electrode 54 formed on one side of the transparent electrode 56 to compensate a resistance component of the transparent electrode 56.

Herein, the bus electrode 54 is formed by etching a chrome Cr, a molybdenum Mo, and a copper Cu, etc. using an etchant consisted of phosphoric acid in a rage of 60 to 65 weight %, nitric acid in a range of 5 to 6 weight %, acetic acid of 10 weight %, and water in a range of 19 to 25 weight %. An inclination angle of the bus electrode 54 formed by using the etchant is relatively large as about 80° to 110°. Accordingly, a taper of the bus electrode 54 is deteriorated. In other words, the bus electrode 54 is formed in an inverse taper type in which the lower portion thereof has a narrower width than the upper portion thereof. An insulating film 58 formed to cover the anode electrode 52 having the bus electrode 54 makes a step coverage to be deteriorated, so that a pinhole A exposing the bus electrode 54 is occurred as shown in FIG. 2. An insulation breakdown is occurred by the pinhole, so that there is a problem that a reliance of the electro-luminescence display device is deteriorated, e.g., the anode electrode 52 and a cathode electrode are shorted.

SUMMARY OF THE INVENTION

Accordingly, it is an object of the present invention to provide an organic electro-luminescence display device and a method of fabricating the same that is capable of reducing an inverse taper of a bus electrode.

In order to achieve these and other objects of the invention, an organic electro-luminescence display device comprises: an anode electrode including a transparent electrode and a bus electrode; a cathode electrode crossing the anode electrode; and an organic layer located at a cross both the anode electrode and the cathode electrode, wherein the bus electrode has an inclination angle of 30° to 70°.

The bus electrode has an inclination angle of 30° to 50°.

The anode electrode includes: the transparent electrode; and the bus electrode located on the transparent electrode.

The anode electrode includes: the bus electrode; and the transparent electrode located on the bus electrode.

In order to achieve these and other objects of the invention, a method of fabricating an organic electro-luminescence display device comprises: forming an anode electrode including a transparent electrode and a bus electrode on a substrate; forming an organic layer generating light on the substrate having the anode electrode; and forming a cathode electrode crossing the anode electrode on the substrate having the organic layer, wherein the bus electrode has an inclination angle of 30° to 70°.

The bus electrode has an inclination angle of 30° to 50°.

The forming the anode electrode having the transparent electrode and the bus electrode on the substrate includes: forming the transparent electrode on the substrate; and forming the bus electrode having the inclination angle of 30° to 70° on the transparent electrode.

The forming the anode electrode having the transparent electrode and the bus electrode on the substrate includes: forming the bus electrode having the inclination angle of 30° to 70° on the substrate; and forming the transparent electrode so as to contact with the bus electrode on the substrate having the bus electrode.

The forming the bus electrode having the inclination angle of 30° to 70° includes: depositing a metal on the substrate; and patterning the metal by a photolithography process and an etching process using an etchant to form the bus electrode.

The etchant is consisted of phosphoric acid in a range of 55 to 60 weight %, nitric acid in a range of 10 to 12 weight %, acetic acid in a range of 8 to 10 weight %, and water in a range of 18 to 27 weight %.

The etchant has a temperature of a normal temperature to 45° C.

The etchant has a temperature of 30° C. to 35° C.

The metal includes at least one of chrome, molybdenum, and cupper.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 3 to 7B.

Figure 1:
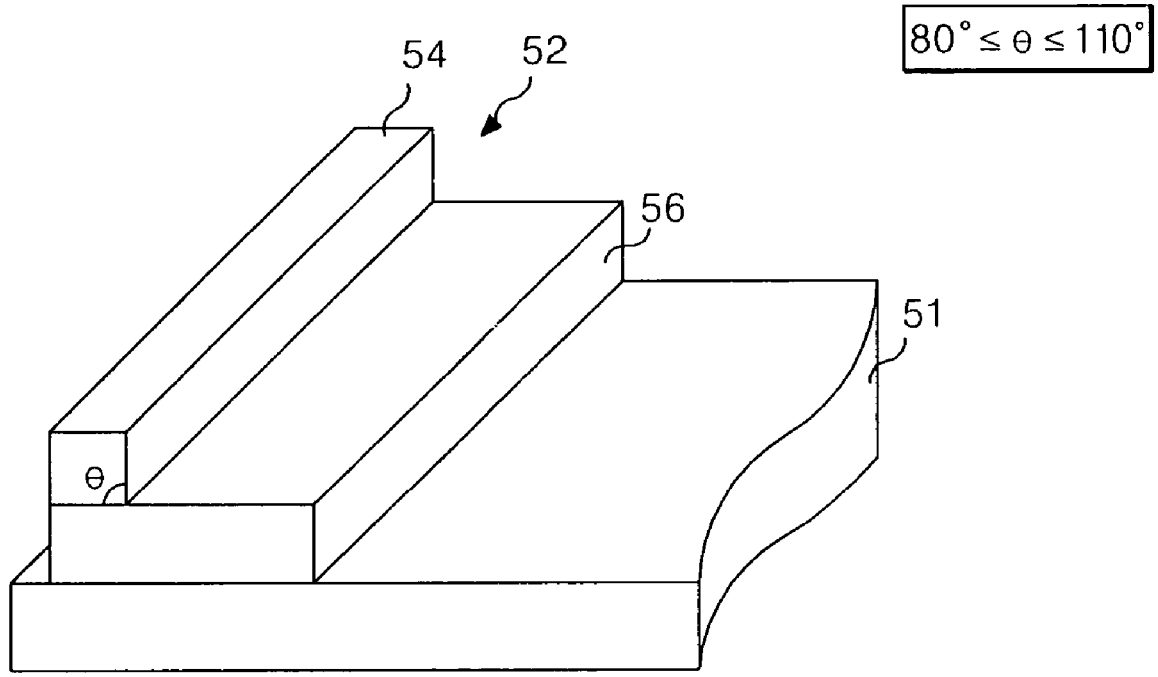
FIG. 1 is a perspective view illustrating an anode electrode of a related art organic electro-luminescence display device.
Figure 2:
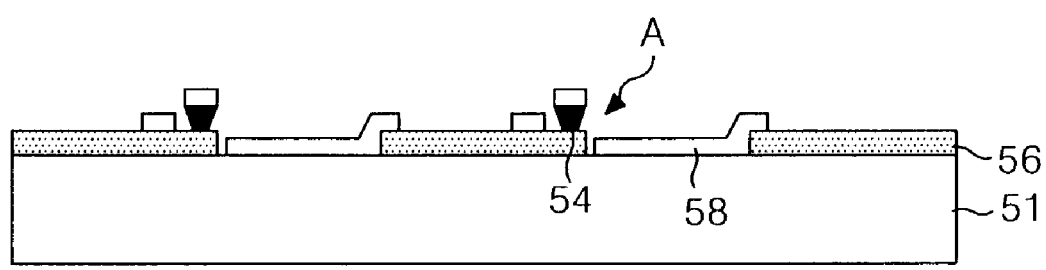
FIG. 2 is a sectional view illustrating a pinhole phenomenon of an insulating film by a bus electrode shown in FIG. 1.
Figure 3:
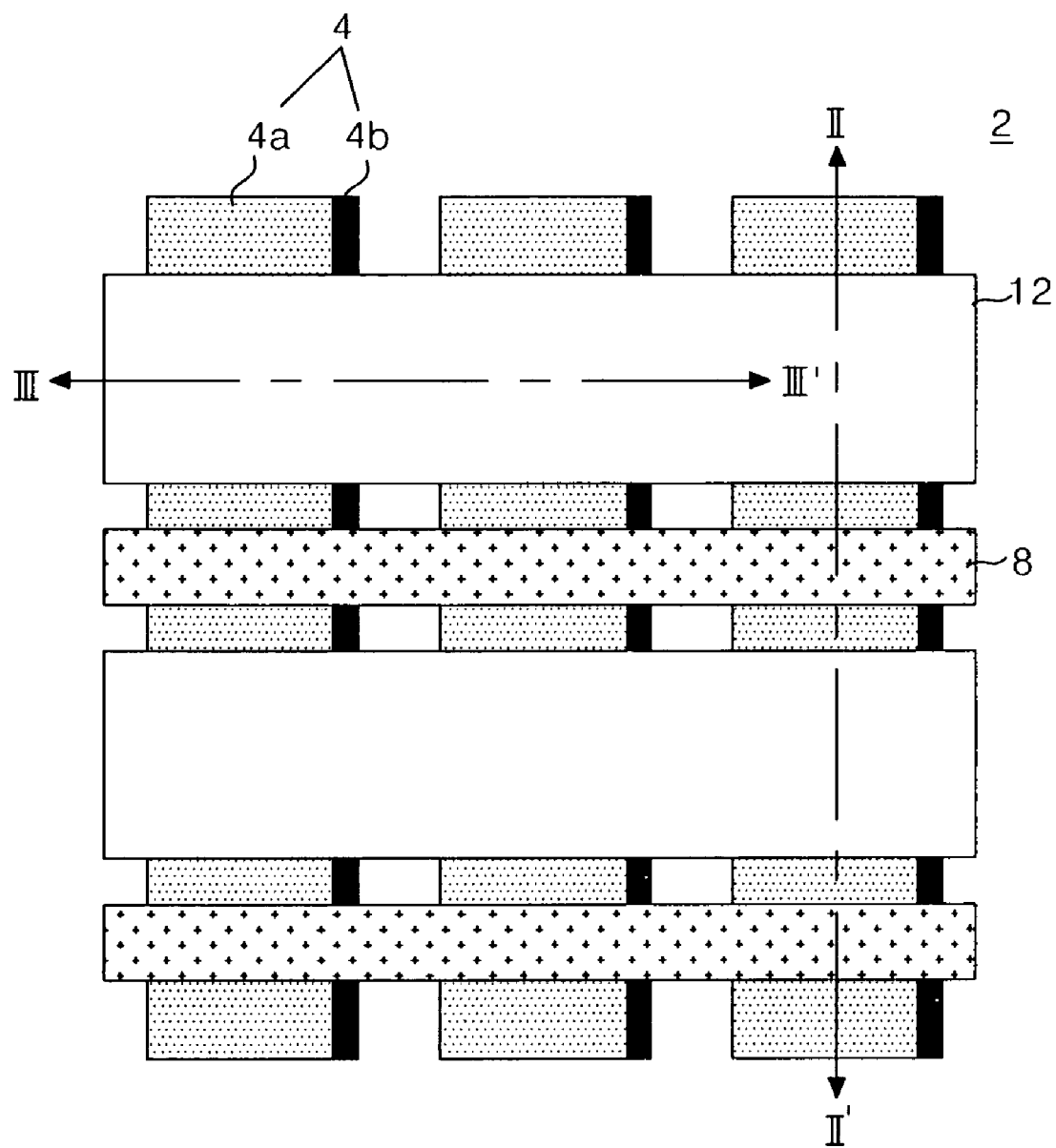
FIG. 3 is a plan view illustrating an organic electro-luminescence display device according to the present invention.
Figure 4:
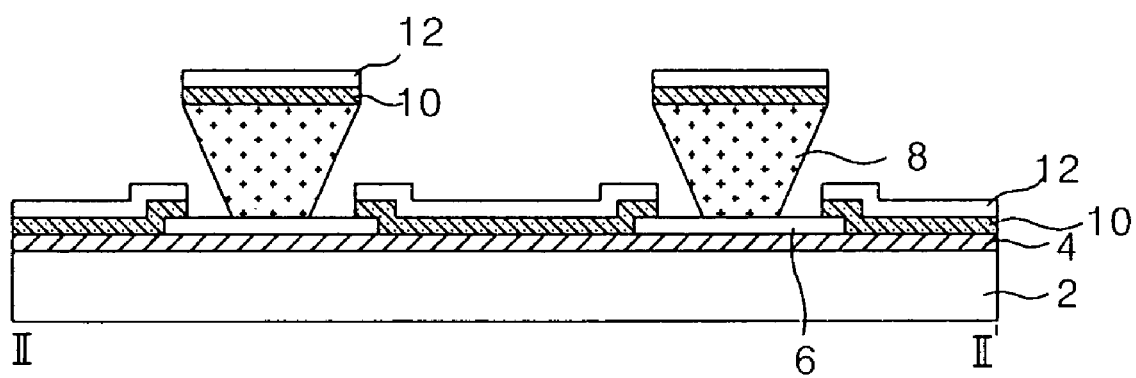
FIG. 4 is a sectional view illustrating the organic electro-luminescence display device taken along a line II-II' in FIG. 3.

FIG. 3 is a plan view illustrating an organic electro-luminescence display device according to the present invention, and FIG. 4 is a sectional view illustrating the organic electro-luminescence display device taken along a line II-II' in FIG. 3.

Referring to FIGS. 3 and 4, the electro-luminescence display device of an embodiment of the invention includes an insulating film 6, a barrier rib 8, and an organic layer 10 formed between, an anode electrode 4 and a cathode electrode 12, which are insulated from each other and crossing each other on a substrate 2.

A plurality of anode electrodes 4 is provided on the substrate 2 in such a manner to be spaced at a predetermined distance from each other. A first driving signal is supplied to such the anode electrode 4 in order to emit an electron (or hole).

Figure 5:
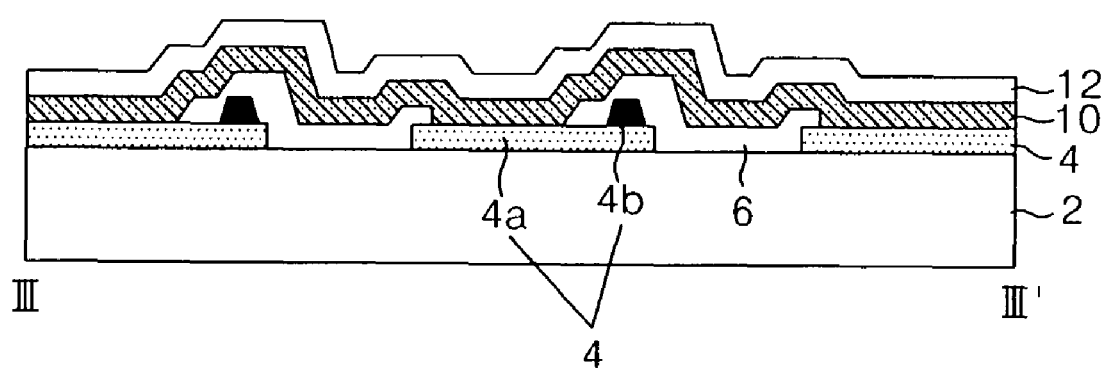
FIG. 5 is a sectional view illustrating the organic electro-luminescence display device taken along a line III-III' in FIG. 3.

As shown in FIG. 5, the anode electrode 4 includes: a transparent electrode 4a made of a transparent conductive material, e.g., indium-tin-oxide ITO, etc., on a substrate 2; and a bus electrode 4b made of chrome Cr, molybdenum Mo, copper Cu, and etc. on one side of the transparent electrode 4a to compensate a resistance component of the transparent electrode 4a. Furthermore, the anode electrode 4 may include: a bus electrode 4b formed on a substrate 2; and a transparent electrode 4a formed on the substrate 2 having the bus electrode 4b.

Herein, the bus electrode 4b is formed to have a relatively smooth inclination angle of about 30° to 70°. Preferably, the bus electrode 4b is formed to have the inclination angle of about 30° to 50°

The insulating film 6 is formed in a lattice type so as to expose an aperture for each EL cell area on the substrate 2 having the anode electrode 4.

The barrier rib 8 is formed in a direction crossing the anode electrode 4, and is formed in parallel to the cathode electrode 12 by a predetermined distance to partition adjacent EL cells. In other words, the barrier rib 8 separates the organic layers 10 from each other and the cathode electrodes 12 from each other between the adjacent EL cells. Further, the barrier rib 8 has an overhang structure in which the upper portion thereof has a larger width than the lower portion thereof.

The organic layer 10 is made of an organic compound on the insulating film 6. In other words, the organic layer 10 is formed by depositing a hole carrier layer, a light-emitting layer and an electron carrier layer onto the insulating film 6.

A plurality of cathode electrodes 12 is provided on the organic layer 10 in such a manner to be spaced at a predetermined distance from each other, and in such a manner to be crossed with the anode electrodes 4. A second driving signal is supplied to the cathode electrode 12 in order to emit a hole (or electron).

As set forth above, in the organic electro-luminescence display device according to the present, the bus electrode 4b is formed to have an inclination angle of 30° to 70°. Accordingly, a taper of the bus electrode 4b having a relatively smooth inclination angle becomes improved, so that a step coverage of the insulating film 6 formed to cover the bus electrode 4b becomes improved. Thus, it is possible to prevent an insulation breakdown.

FIGS. 6A to 6F are plan views and sectional views representing a method of manufacturing the organic electro-luminescence display device according to the present invention.

Firstly, a transparent conductive material, e.g., indium-tin-oxide, etc., is deposited and then patterned on a substrate 2, to thereby form a transparent electrode 4a of an anode electrode on the substrate as shown in FIG. 6.

Figure 6A:
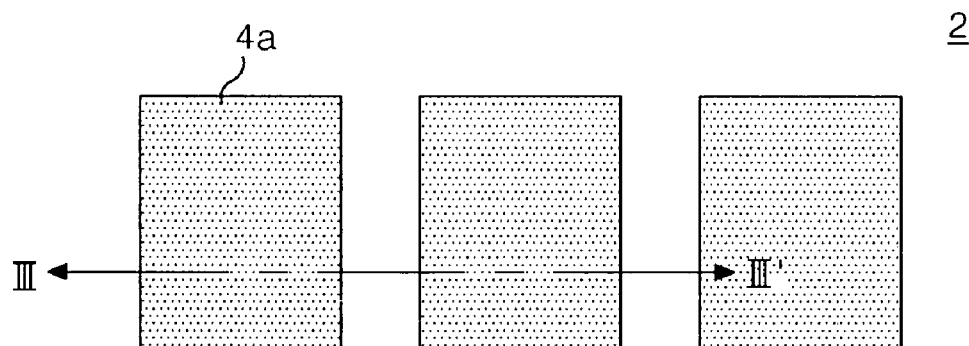
FIGS. 6A to 6F are plan views and sectional views representing a method of manufacturing the organic electro-luminescence display device according to the present invention.
Figure 6A:
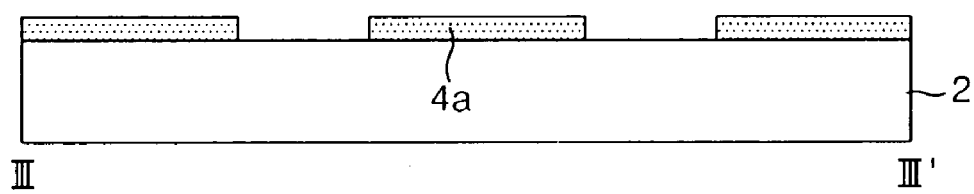
Figure 6B:
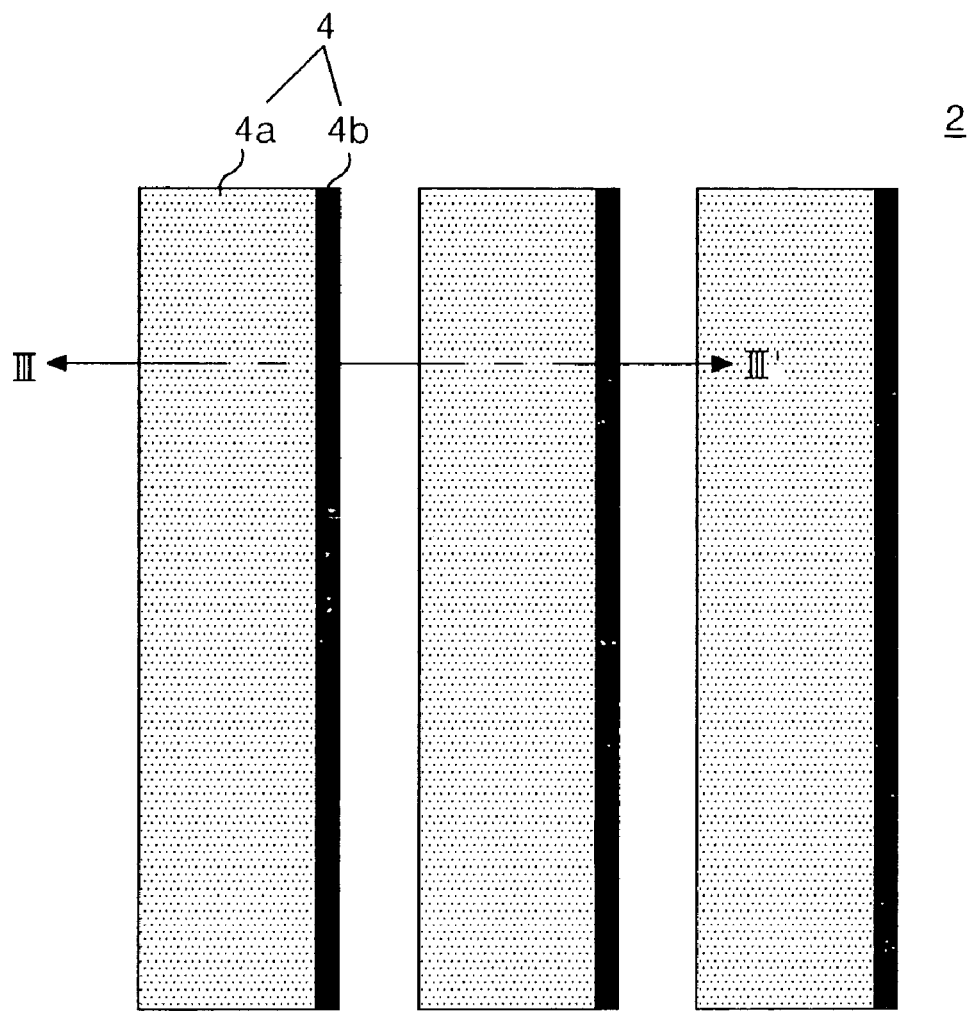
Figure 6B:
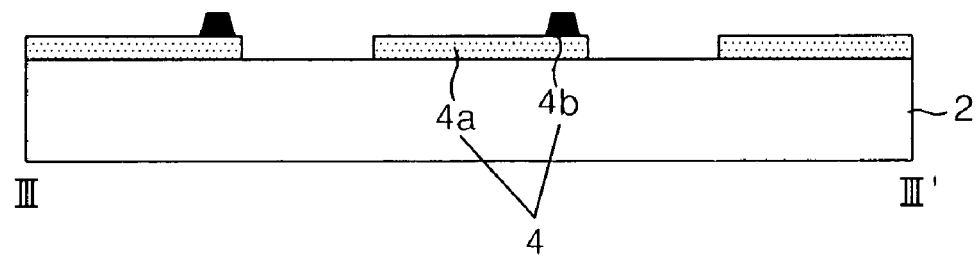

Chrome Cr or Molybdenum Mo, etc. is deposited on the substrate 2 having the transparent electrode 4a and then is patterned by a photolithography process and an etching process using an etchant consisted of phosphoric acid in a range of 55 to 60 weight %, nitric acid in a range of 10 to 12 weight %, acetic acid in a range of 8 to 10 weight %, and water in a range of 18 to 27 weight %, to thereby form a bus electrode 4b of an anode electrode having a taper angle of 30° to 70° as shown in FIG. 6B. The etching process of the bus electrode 4b will be described in detail later.

Figure 6C:
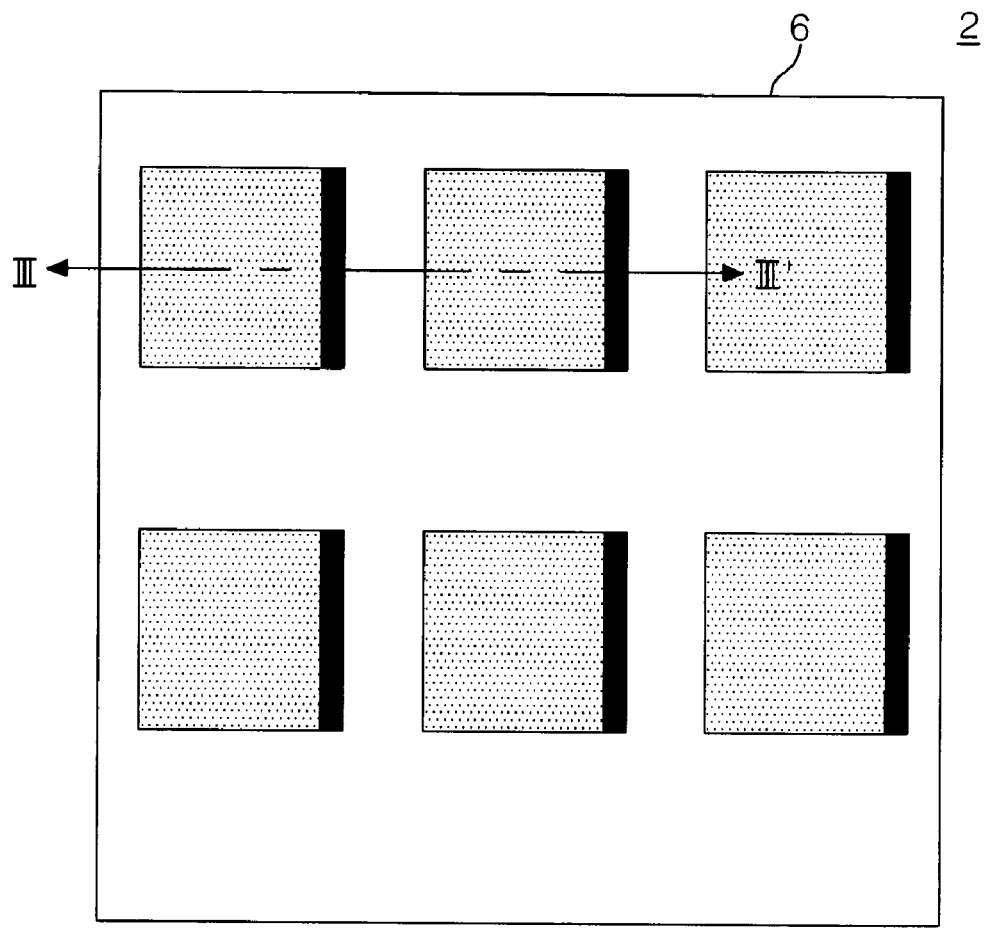
Figure 6C:
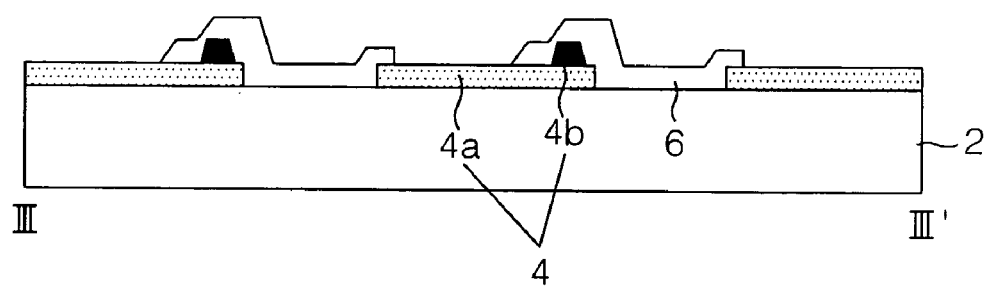

A photosensitive insulating material is deposited and then patterned on the substrate 2 having the anode electrode 4, to thereby form a insulating film 6 as shown in FIG. 6C. The insulating film 6 is formed in a lattice type at an entire portion except for a light-emitting portion.

Figure 6D:
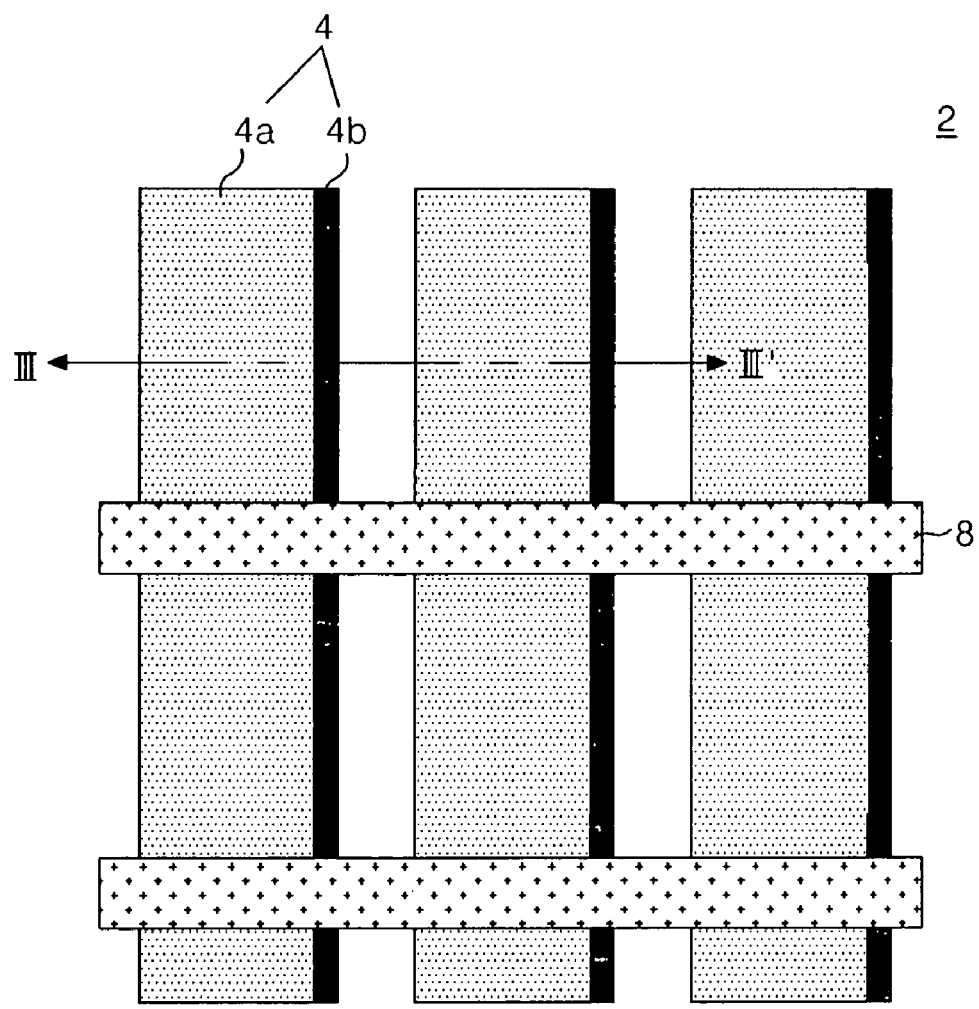
Figure 6D:
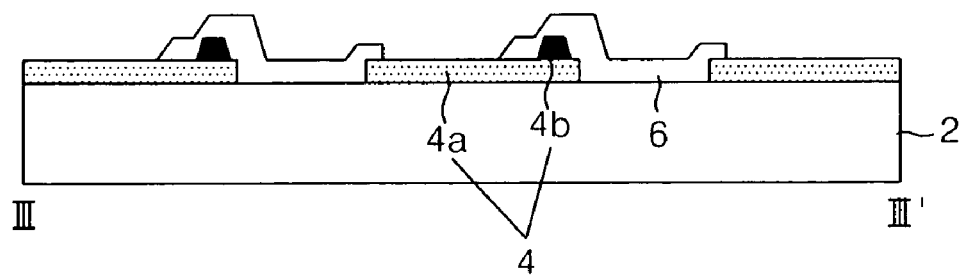

A photosensitive insulating material is deposited and then patterned on the substrate 2 having the insulating film 6, to thereby form a barrier rib 8 as shown in FIG. 6D. The barrier rib 8 is formed with a predetermined distance from adjacent barrier ribs in a direction crossing the anode electrode 4, and is formed at a non-light emitting portion.

Figure 6E:
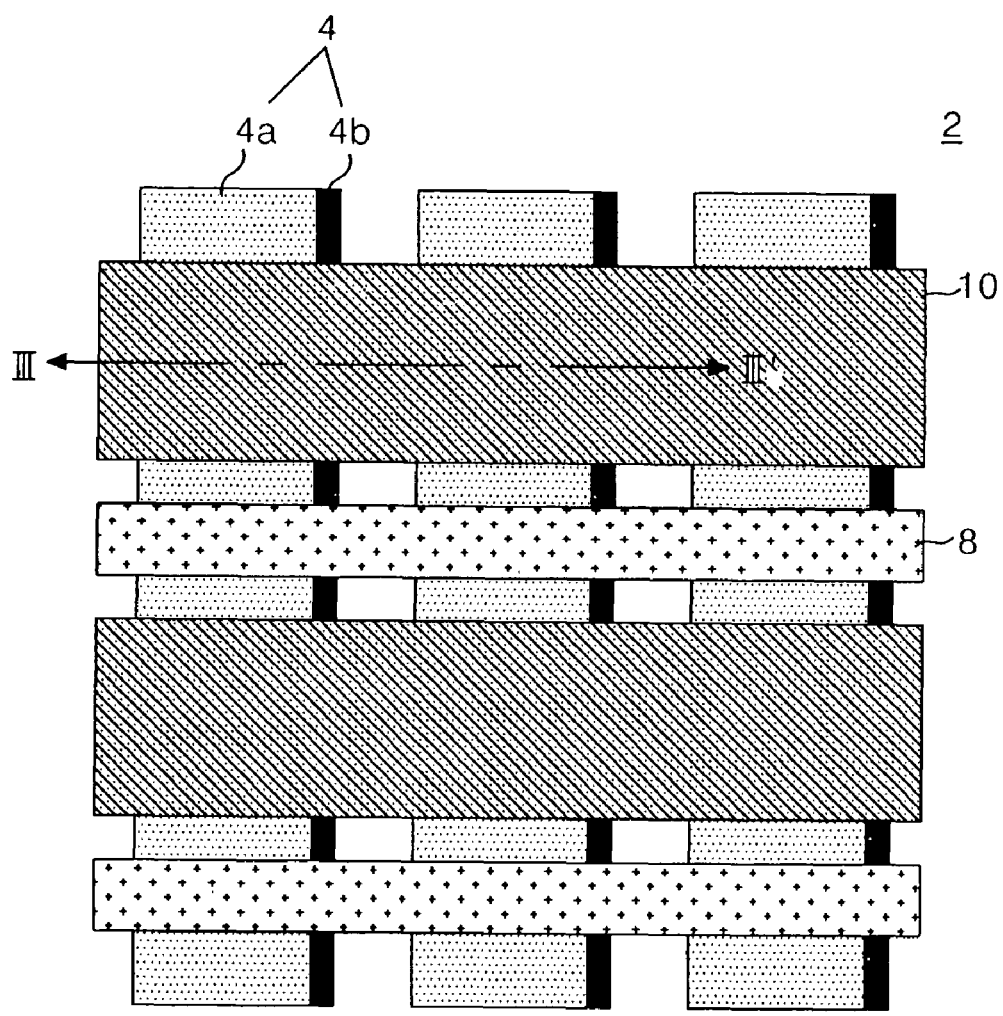
Figure 6E:
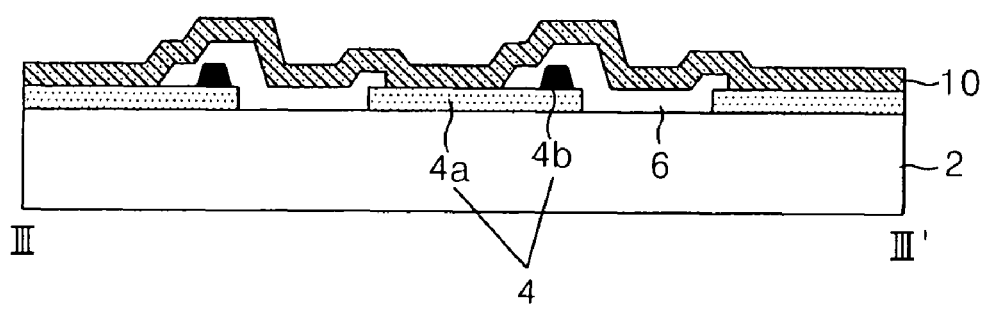

An organic layer 10 is formed on the substrate having the barrier rib 8 as shown in FIG. 6E. The organic layer 10 includes hole carrier layer, a light emitting layer, and an electron carrier layer.

Figure 6F:
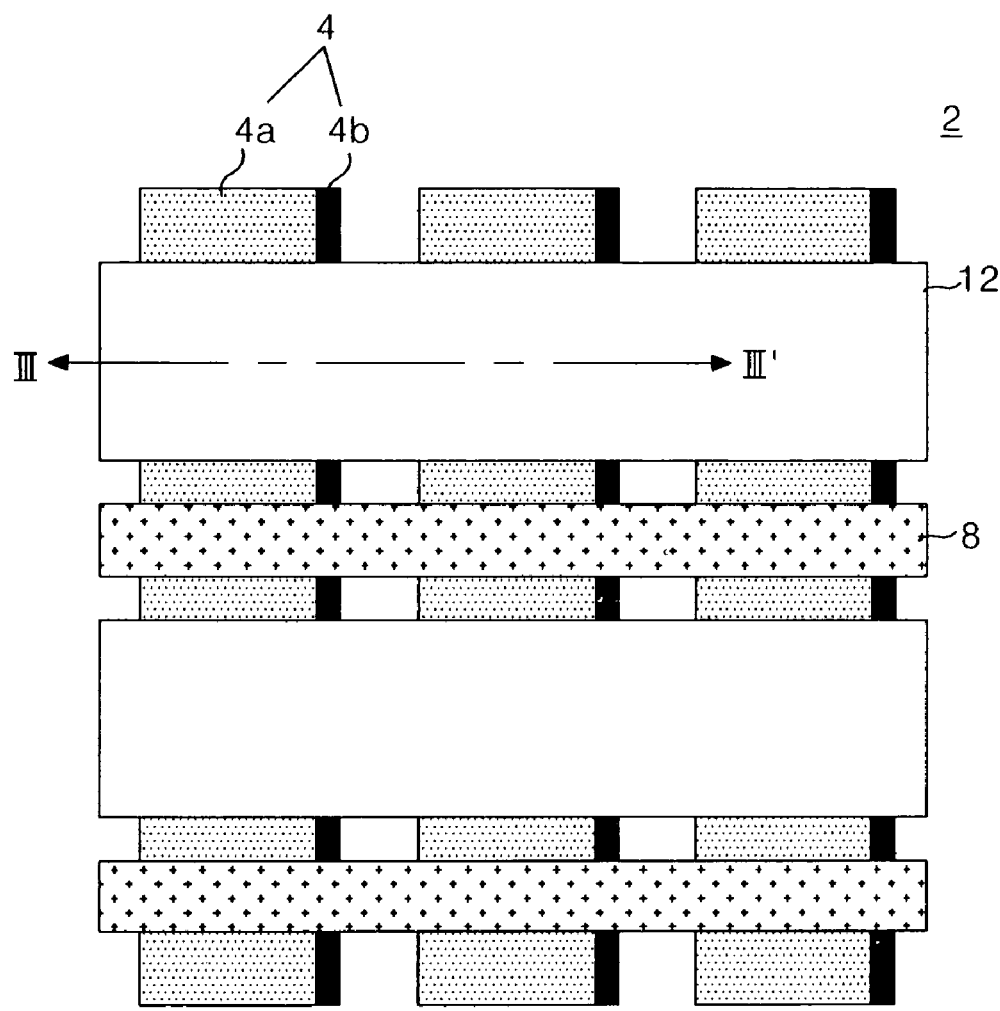
Figure 6F:
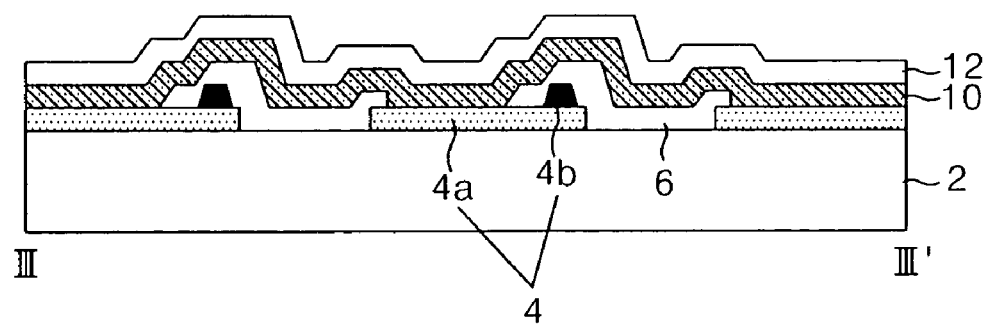

A cathode electrode 12 is formed on the substrate 2 having the organic layer 10 as shown in FIG. 6F. At this time, the cathode electrode 12 is entirely deposited to be formed, but is separated for each EL cell by the barrier rib having a relatively high height to be formed.

Meanwhile, the bus electrode 4b of the anode electrode according to the present invention is formed with result that a metal such as chrome Cr, molybdenum Mo, copper Cu, etc. is etched by an anisotropic etching manner using an etchant consisted of compositions shown in table 1, at a temperature of a normal temperature to 45° C., preferably temperature of about 30° C. to 35° C. The bus electrode 4b formed by the etching manner using the etchant has an inclination angle of 30° to 70°.

TABLE 1

| | Phosphoric acid | Nitric acid | Acetic acid | Water |
|---|---|---|---|---|
| Composition content (wight %) | 55 to 60 | 10 to 12 | 8 to 10 | 18 to 28 |

As shown in Table 1, a content of nitric acid becomes larger by about double amount than that of the related art, so that an etching speed of a metal making the bus electrode 4b becomes slower. Accordingly, the bus electrode 4b can be formed with an inclination angle smaller than that of the related art.

Meanwhile, an etching amount and inclination angle of the bus electrode 4b formed by the etchant shown in Table 1 are differentiated depending upon a temperature of the etchant as shown in Table 2.

TABLE 2

| Temperature of etchant (° C.) | first location | second location | third location | Inclination angle of bus electrode |
|---|---|---|---|---|
| 30° C. | 0.20 μm | 0.21 μm | 0.28 μm | 40° C. to 49° C. |
| 40° C. | 0.54 μm | 0.44 μm | 0.52 μm | 54° C. to 63° C. |

Figure 7A:
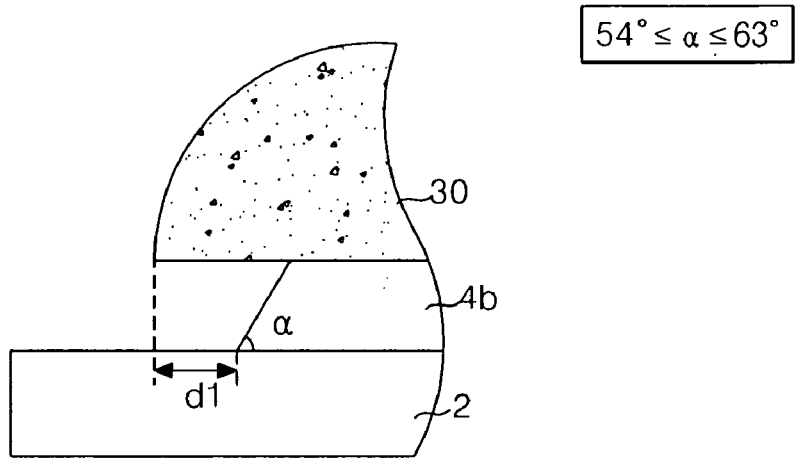
FIGS. 7A and 7B are sectional views illustrating a taper angle of a bus electrode in accordance with a temperature of an etchant.

In a case that a temperature of the etchant is 40° C., the bus electrode 4b located at a first location (near upper corner of right side in the substrate) is etched by about 0.54 μm from end of a photo-resist pattern 30 formed by an etching process and a developing process as shown in FIG. 7A, the bus electrode 4b located at a second location (near center of the substrate) is etched by about 0.44 μm from end of the photo-resist pattern 30, and the bus electrode 4b located at a third location (near lower corner of left side of the substrate) is etched by about 0.52 μm from end of the photo-resist pattern 30. As set forth above, when the temperature of the etchant is 40° C., the bus electrode 4b is over-etched by a first width d1 from end of the photo-resist pattern 30 and the bus electrode 4b has a inclination angle α of about 54° to 63°.

Figure 7B:
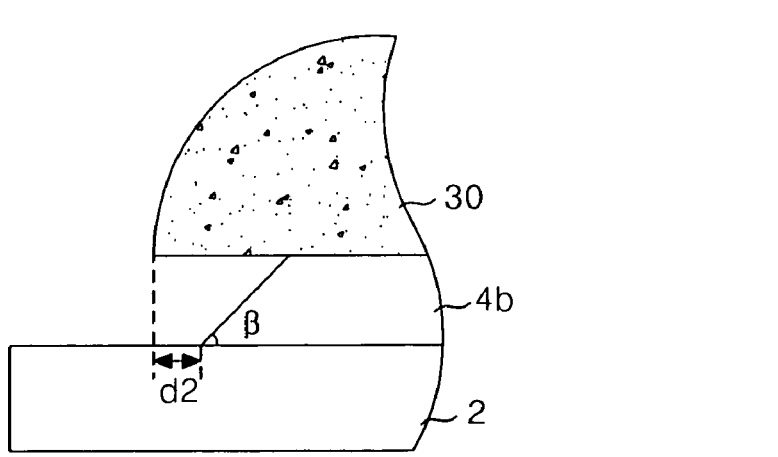

On the other hand, in a case that a temperature of the etchant is 30° C., the bus electrode 4b located at a first location (near upper corner of right side in the substrate) is etched by about 0.20 μm from end of a photo-resist pattern 30 formed by an etching process and a developing process as shown in FIG. 7B, the bus electrode 4b located at a second location (near center of the substrate) is etched by about 0.21 μm from end of the photo-resist pattern 30, and the bus electrode 4b located at a third location (near lower corner of left side of the substrate) is etched by about 0.28 μm from end of the photo-resist pattern 30. As set forth above, when the temperature of the etchant is 30° C., the bus electrode 4b is over-etched by a second width shorter than the first width d1, from end of the photo-resist pattern 30, and the bus electrode 4b has a inclination angle β of about 40° to 49°.

As set forth above, when the temperature of the etchant is 30° C. as compared with 40° C., an over-etched amount of the bus electrode 4b is a relatively small and inclination angle of the bus electrode 4b becomes relatively smaller.

As described above, in the organic electro-luminescence display device and the method of fabricating the same according to the present invention, the bus electrode is formed to have the inclination angle of 30° to 70°. Accordingly, the taper of the bus electrode having a relatively smooth inclination angle becomes improved, so that a step coverage of the insulating film formed to cover the bus electrode becomes improved. Thus, it is possible to prevent an insulation breakdown.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro-luminescence display device, comprising:
    at least two anode electrodes, each anode electrode including a transparent electrode and a bus electrode, the transparent electrode having a first surface facing a substrate, the bus electrode located on a second surface of the transparent electrode opposite of the first surface;
    an insulating film located between two adjacent anode electrodes, wherein the insulating film overlaps edge portions of the respective transparent electrodes and only entirely covers one of the bus electrodes of the two adjacent anode electrodes;
    a cathode electrode crossing the anode electrode; and
    an organic layer located in between the anode electrode and the cathode electrode,
    wherein the bus electrode has a taper shape and an inclination angle of 46° to 70°.

2. The device according to claim 1, wherein the bus electrode has an inclination angle of 46° to 50°.

3. The device according to claim 1, wherein the bus electrode is not in contact with the substrate.

4. The device according to claim 1, wherein an inclination angle of the transparent electrode is different from the inclination angle of the bus electrode.

5. The device according to claim 1, wherein the inclination angle is an angle between the second surface of the transparent electrode and a side surface of the bus electrode.

6. A method of fabricating an organic electro-luminescence display device, comprising:
    forming at least two anode electrodes, each anode electrode including a transparent electrode and a bus electrode on a substrate, the transparent electrode having a first surface facing the substrate, the bus electrode located on a second surface of the transparent electrode opposite of the first surface;
    forming an insulating film located between two adjacent anode electrodes, wherein the insulating film overlaps edge portions of the respective transparent electrodes and only entirely covers one of the bus electrodes of the two adjacent anode electrodes;
    forming an organic layer generating light on the substrate having the anode electrode; and
    forming a cathode electrode crossing the anode electrode on the substrate having the organic layer,
    wherein the bus electrode has a taper shape and an inclination angle of 46° to 70° '
    wherein the step of forming the bus electrode includes depositing a metal on the substrate, and patterning the metal by a photolithography process and an etching process using an etchant, and
    wherein the etchant comprises phosphoric acid in a range of 55 to 60 weight %, nitric acid in a range of 10 to 12 weight %, acetic acid in a range of 8 to 10 weight %, and water in a range of 18 to 27 weight %.

7. The method according to claim 6, wherein the bus electrode has an inclination angle of 46° to 50°.

8. The method according to claim 6, wherein the etchant has a temperature of a normal temperature to 45° C.

9. The method according to claim 8, wherein the etchant has a temperature of 30° C. to 35° C.

10. The method according to claim 6, wherein the metal includes at least one of chrome, molybdenum, and copper.

* * * * *